United States Patent [19]
Iwasaki et al.

[11] Patent Number: 5,628,111
[45] Date of Patent: May 13, 1997

[54] METHODS OF FABRICATING OF SEMICONDUCTOR PACKAGE AND MOUNTING OF SEMICONDUCTOR DEVICE

[75] Inventors: Hiroshi Iwasaki; Hideo Aoki, both of Kanagawa-ken, Japan

[73] Assignee: Kabushiki Kaisha Toshiba, Kanagawa-ken, Japan

[21] Appl. No.: 396,236

[22] Filed: Mar. 1, 1995

[30] Foreign Application Priority Data

Mar. 2, 1994 [JP] Japan .................................. 6-032294

[51] Int. Cl.$^6$ ........................................... H05K 3/30
[52] U.S. Cl. .................................. 29/841; 29/740
[58] Field of Search .......................... 29/841, 832, 740; 437/211, 214; 156/304.6, 306.9

[56] References Cited

U.S. PATENT DOCUMENTS

| | | | |
|---|---|---|---|
| 4,715,115 | 12/1987 | King et al. | 29/841 |
| 5,074,947 | 12/1991 | Estes et al. | 29/832 X |
| 5,232,532 | 8/1993 | Hori | 29/740 X |

FOREIGN PATENT DOCUMENTS

61-281540  12/1986  Japan ..................................... 29/841

*Primary Examiner*—Larry I. Schwartz
*Assistant Examiner*—Khan Nguyen
*Attorney, Agent, or Firm*—Finnegan, Henderson, Farabow, Garrett & Dunner, L.L.P.

[57] ABSTRACT

A method of fabricating a semiconductor package comprising the steps of setting a semiconductor chip having a pad with protruding electrodes on an insulation board having a main surface on which a wiring circuit and connection terminals are formed and an other main surface on which flat-type external connecting terminals are formed, to align the protruding electrodes of the semiconductor chip with the connection terminals of the insulating board, wherein the insulating board is installed on a pressing stage, pressing the semiconductor chip onto the insulation board to connect the protruding electrodes to the connection terminals, clamping the semiconductor chip and the insulation board by clamping means to form a clamped unit which keeps the pressure on the semiconductor chip and the insulation board, transferring the clamped unit from the pressing stage to a resin supplying stage, supplying a sealing resin in a space formed between an upper surface of the circuit board and a lower surface of the semiconductor chip in the clamped unit, transferring the resin supplied unit from the resin supplying stage to a resin curing stage, curing the sealing resin filled in the space formed between the upper surface of the insulation board and the lower surface of the semiconductor chip in the clamped unit, and removing the clamping means from the clamped unit after the curing of the sealing resin is completed.

12 Claims, 5 Drawing Sheets

METHODS OF FABRICATING OF SEMICONDUCTOR PACKAGE AND MOUNTING OF SEMICONDUCTOR DEVICE

BACKGROUND OF THE INVENTION

1. Field of the Invention

The present invention relates to a method of fabricating semiconductor packages and to a method of mounting semiconductor device and to a semiconductor device mounting apparatus; i.e., to a method of packaging flip chips, to a method of mounting flip chips or semiconductor devices similar to flip chips by pressure welding toward a connection terminal on a circuit board, and to a semiconductor device mounting apparatus.

2. Description of the Related Art

Figure 1:
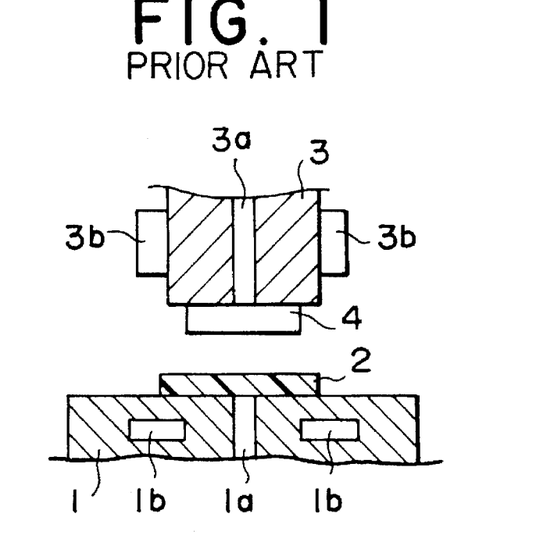
FIG. 1 shows a semiconductor chip aligned with and mounted on a circuit board in a conventional pressure mounting method.
Figure 2:
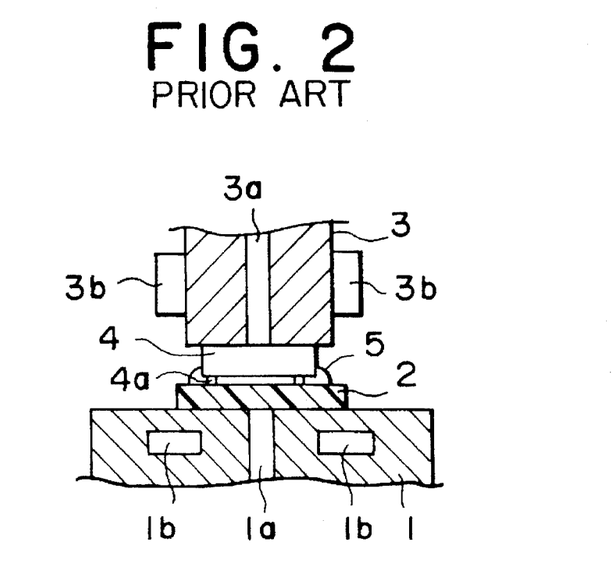
FIG. 2 shows a sealing resin provided around a semiconductor chip pressed onto the circuit board in a conventional pressure mounting method.

Packaging apparatuses for mounting IC elements (IC elements or IC devices) on predetermined circuit boards are widely used in miniaturizing circuit systems of electronic devices. For such packaging apparatuses, a pressure welding method is applied to electrically connect flip chips, including IC elements, to a circuit board, as illustrated in FIG. 1 and FIG. 2. Firstly, a predetermined circuit board 2 is fixed by suction to a stage 1 shown in FIG. 1. At the same time, a bare chip 4, fixed by suction to a pick-up head 3, is aligned with stage 1.

In FIG. 1, 1a indicates a vacuum suction system of a stage 1, 3a indicates a vacuum suction system of a pick-up of a head 3, 1b indicates a heating device mounted on a stage 1, and 3b indicates a heating device mounted on the pick-up head 3. The stage 1 and the pick-up head 3 are movable along the X, Y, and Z axes, as well as around the rotational axis. Such mobility enables easy transfer-alignment of the flip chip 4.

Secondly, as illustrated in FIG. 2, the bare chip 4 mounted on the pick-up head 3 is aligned with the circuit board 2 which is fixed by suction to the stage 1. While clamping the bare chip 4 to the pick-up head 3, sealing resin 5 is provided to finally attach the aligned bare chip 4 to the circuit board 2. The heating devices, 1b and 3b, heat the stage 1 and the pick-up head 3 to cure the sealing resin 5. This process is strong enough to weld the protruding electrode 4a of a bare chip 4 to the surface of the circuit board 2. The heating temperature and time are designed to ensure sufficient heat curing of the said shield resin 5.

Thus, conventional methods of mounting bare chips use unitarily packaging apparatuses having functions such as alignment, clamping, and heat curing of sealing resin. Thus, one single packaging apparatus covers all the processes including transfer alignment of the bare chip 4 to the circuit board 2, clamping the aligned and mounted bare chip, and provision and curing of sealing resin 5. This kind of apparatus cures the sealing resin 5 using its own heating devices 1b and 3b while clamping the bare chip 4 to the circuit board 2. The heat curing process takes time, which decreases the efficiency of packaging and the productivity (or availability factor) of the semiconductor device mounting apparatus. One bare chip 4 must always occupy the whole system, including the alignment and pressuring devices, for a fixed amount of time until the sealing resin 5 is heat cured. Thus, other bare chips cannot be mounted until the heat curing process is finished, which decreases productivity and increases manufacturing costs.

Accordingly, it is an object of the present invention to provide a method of fabricating a semiconductor package at low cost.

It is another object of the present invention to provide a method of fabricating a semiconductor package with high reliability.

It is another object of the present invention to provide a method of fabricating a semiconductor package with good yield.

It is another object of the present invention to provide a method of mounting a semiconductor device for fabricating a semiconductor package at low cost.

It is another object of the present invention to provide a method of mounting a semiconductor device for fabricating a semiconductor package with high reliability.

It is another object of the present invention to provide a method of mounting a semiconductor device for fabricating a semiconductor package with good yield.

It is another object of the present invention to provide a semiconductor device mounting apparatus which enables a semiconductor package to be fabricated at low cost.

It is another object of the present invention to provide a semiconductor device mounting apparatus which enables a semiconductor package to be fabricated with high reliability.

It is another object of the present invention to provide a semiconductor device mounting apparatus which enables a semiconductor package to be fabricated with good yield.

SUMMARY OF THE INVENTION

A method of fabricating a semiconductor package in accordance with this invention comprises the steps of setting a semiconductor chip having a pad with protruding electrodes on an insulation board having a main surface on which a wiring circuit and connection terminals are formed and an other main surface on which flat-type external connecting terminals are formed, to align the protruding electrodes of the semiconductor chip with the connection terminals of the insulating board, wherein the insulating board is installed on a pressing stage, pressing the semiconductor chip onto the insulation board to connect the protruding electrodes to the connection terminals, clamping the semiconductor chip and the insulation board by clamping means to form a clamped unit which keeps the pressure on the semiconductor chip and the insulation board, transferring the clamped unit from the pressing stage to a stage for supplying and filling a sealing resin, supplying a sealing resin in a space formed between an upper surface of the insulation board and a lower surface of the semiconductor chip in the clamped unit, transferring the resin supplied unit from the resin supplying stage to a resin curing stage, curing the sealing resin filled in the space formed between the upper surface of the insulation board and the lower surface of the semiconductor chip in the clamped unit, and removing the clamping means after the curing of the sealing resin is completed.

A method of mounting a semiconductor device in accordance with this invention comprises the steps of setting a semiconductor chip having pads with protruding electrodes on a circuit board having a main surface on which a wiring circuit including connection terminals, to oppose the pads of the semiconductor chip to the connection terminals of the circuit board and to align the protruding electrodes with the connection terminals, wherein the circuit board is positioned on a pressing stage, pressing the semiconductor chip onto the circuit board to connect the protruding electrodes to the connection terminals, clamping the semiconductor chip and the circuit board by clamping means to form a clamped unit which keeps the pressure on the semiconductor chip and the circuit board, transferring the clamped unit from the pressing stage to a stage for supplying and filling a sealing resin, supplying a sealing resin in a space formed between an upper surface of the circuit board and a lower surface of the semiconductor chip in the clamped unit, transferring the resin-supplied unit from the resin supplying stage to a resin-curing stage, curing the sealing resin filled in the space formed between the upper surface of the circuit board and the lower surface of the semiconductor chip in the clamped unit, and removing the clamping means after the curing of the sealing resin is completed.

In the fabrication method of the semiconductor package and the mounting method of the semiconductor device described above, it is possible to apply heat at a temperature of not more than 300° C. in the clamping process while maintaining the pressure on the semiconductor chips onto the insulating sheet or the circuit board. It is also possible to apply heat at a temperature of not more than 300° C. in the process of filling the sealing resin in the space between the surfaces of the insulating sheet or circuit board and the semiconductor chip. In such heating processes, comparatively low temperatures result in better junction between the connection terminals. Further, the semiconductor chips may be replaced with semiconductor packages installed with a flip chip on the main surface of the board and with a flat-type external connection terminals led-through and exposed on the rear surface of the board.

A semiconductor device mounting apparatus in accordance with this invention comprises a first stage including means for setting a semiconductor chip having pads with protruding electrodes on a circuit board having a main surface on which a wiring circuit including connection terminals, to oppose the pads of the semiconductor chip to the connection terminals of the circuit board and to align the protruding electrodes with the connection terminals, means for pressing the semiconductor chip onto the circuit board to connect the protruding electrodes to the connection terminals, and means for clamping the semiconductor chip and the circuit board to keep the pressure on the semiconductor chip and the circuit board, the clamping means comprising a holder for attachably or detachably holding the semiconductor chip and the circuit board.

Moreover, a semiconductor device mounting apparatus of the invention further comprises a second stage including means for supplying a sealing resin and filling the sealing resin in a space formed between an upper surface of the circuit board and a lower surface of the semiconductor chip, the second stage being disposed next to the first stage, and a third stage including means for curing the sealing resin filled in the space formed between the upper surface of the circuit board and the lower surface of the semiconductor chip, the third stage being provided with a heating system and disposed next to the second stage, wherein transfer means are provided between the first stage to the second stage and between the second stage and the third stage.

The mounting device can be used to fabricate and assemble a semiconductor package in bare chip form to be mounted, for instance, on the main surface of an insulation board. Instead of semiconductor chips to be aligned and clamped, it is also possible to use a semiconductor package where bare chips on the main surface of the insulation board mentioned above, and a flat-type external connecting terminal is led-through and exposed on the other surface of the board. It is possible to construct the apparatus by installing multiple circuit board holders with clamping systems to have them function in parallel or retentively.

An insulation board in accordance with this invention can be a resin or ceramic sheet, for example, about 0.15–0.4 mm thick of a similar shape to the semiconductor chip (bare chip) to be mounted. The circuit board may be a thin or thick film circuit board having an insulation layer of a glassy substance, alumina, aluminum nitride or silicon nitride, or having an insulation layer of polyimide resin, glass-epoxy resin or the like. Further, as a semiconductor chip to be mounted on the circuit board, bare-chip-type or a package-type chips having terminals led through to the other (rear) side are usable.

Normally, semiconductor chips are installed with protruding electrodes (bumps) on a pad side functioning as a connection terminal. When a resin which is hardened by ultra violet rays is used as the curable resin, black light should be used as a source.

Further, the semiconductor package fabrication method in accordance with this invention comprises the steps of aligning protruding electrodes of a semiconductor chip with connection terminals of a wiring circuit plane (of an insulation board), pressing the semiconductor chip onto the wiring circuit plane to connect the protruding electrodes to the connection terminals, clamping the semiconductor chip and the insulation board by clamping means to keep the pressure on the semiconductor chip and the insulation board. Then, the clamped body of the semiconductor chip and the insulation board is transferred to a separate stage from the pressing stage for supplying and filling a sealing resin. Next, the sealing resin is filled in a space formed between an upper surface of the insulation board and a lower surface of the semiconductor chip, and cured.

In the method of mounting a semiconductor device in accordance with this invention, desired semiconductor chips are, firstly, aligned and disposed (mounted) onto the wiring circuit and, secondly, are clamped onto the circuit board (connecting portion) by a separate clamping (fixing) device. Then, sealing resin separately prepared is supplied to the filling system and to the heat curing system. Thus, the semiconductor chips are connected to the wiring circuit and partly sealed by the hardened resin, while keeping the pressure. Thus, this semiconductor device mounting method comprises two separate stages; in the first stage, alignment, mounting and clamping (fixing) are done; and in the second stage, the sealing resin is filled and heat cured. Thus, while the resin is being filling and hardened, the next semiconductor chip can be aligned and mounted onto another circuit board, which increases productivity and decreases fabrication costs.

A semiconductor device mounting apparatus in accordance with this invention comprises a first stage including means for aligning protruding electrodes of a semiconductor chip with connection terminals of a circuit board, means for pressing the semiconductor chip onto the circuit board to connect the protruding electrodes to the connection terminals, and means for clamping the semiconductor chip and the circuit board to keep the pressure on the semiconductor chip and the circuit board, and a second stage including means for filling a sealing resin in a space formed between an upper surface of the circuit board and a lower surface of the semiconductor chip, means for curing the sealing resin filled in the space formed between the upper surface of the circuit board and the lower surface of the semiconductor chip. Thereby, the semiconductor chip is connected to the circuit board, and the space formed between the semiconductor chip and the circuit board is sealed.

Thus, the method of mounting a semiconductor device comprises two separate steps. First the aligned and mounted semiconductor chips are clamped and then removed from a mounting/disposing stage and transferred to a resin filling system or a heat curing apparatus. Thus, even while a resin is being filled and hardened, the next semiconductor chip can be aligned and disposed (mounted) to another circuit board or the like, which increases productivity and decreases fabrication costs.

DESCRIPTION OF THE PREFERRED EMBODIMENTS

Next, embodiments of the present invention will be described with reference to FIGS. 3 to 10.

First Embodiment

Figure 3A:
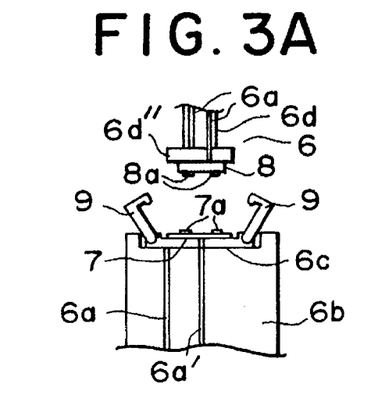
FIG. 3A and FIG. 3B are sectional views showing an example of a construction of principal portions of a semiconductor device mounting apparatus in accordance with the present invention.
Figure 3B:
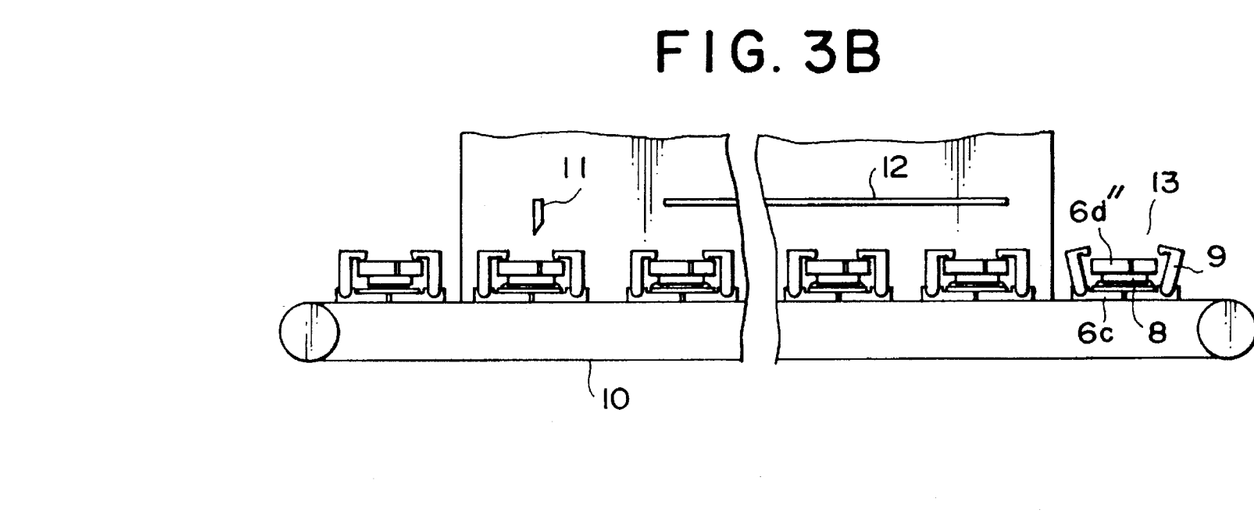
Figure 4:
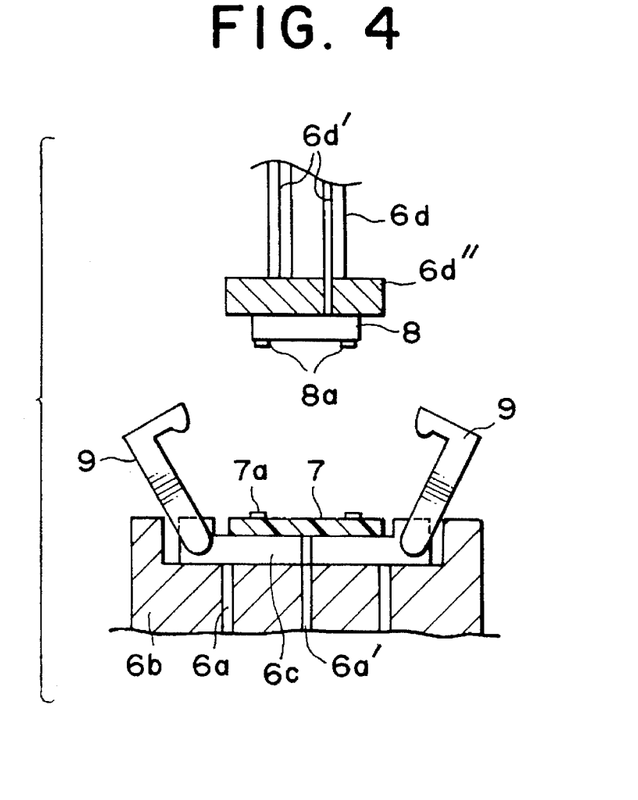
FIG. 4 shows an example of a semiconductor chip aligned with and mounted on a circuit board in accordance with the present invention.

FIG. 3A and FIG. 3B are sectional views showing the constructions of the principal portions of a semiconductor device mounting apparatus in accordance with a first embodiment of the present invention. In FIG. 3A, firstly, a semiconductor chip 8 is placed on a circuit board 7. A mounting system 6 is constructed so as to align a bump 8a of the semiconductor chip 8 with connection terminals 7a of the circuit board 7. A mounting system 6 for aligning and mounting a semiconductor chip 8 comprises (1) a stage main body 6b installed with a vacuum-suction system 6a, (2) a removable stage accessory (circuit board holder) 6c disposed on a stage main body 6b, and (3) other devices including a pick-up device 6d installed with a vacuum-suction system 6d' disposed opposite to a stage accessory 6c. The removable stage accessory 6c is installed with a vacuum-suction device 6a' for mounting a circuit board 7. A pick-up device 6d has the following two functions: a vacuum/holding function for holding a semiconductor chip 8 using a pick-up head accessory 6d", and a pressure function (pressure device) for pressing a semiconductor chip 8 onto a circuit board surface 7 and connecting a pad 8a of a semiconductor chip 8 to the connection terminals 7a of the circuit board 7. In this construction, the stage main body 6b and the pick-up device 6d are constructed to be transferred and controlled in X, Y, Z axis and rotation axis.

Further, a clamping device 9 is installed to hold the semiconductor 8 pressed against the circuit board 7 mounted on the stage main body 6b. In this construction, the clamping device 9 is attached to the removable stage accessary 6c. As shown in FIG. 3B, a transfer device 10 is installed next to the aligning/mounting device 6. Thus, the transfer device 10 automatically or manually transfers the clamped components, comprising a stage accessory 6c, a circuit board 7, a semiconductor chip 8, and a pick-up head accessory 6d", from an aligning/mounting device 6 to the next stage. Devices 11, 12 and 13 are installed along the transfer device 10. Device 11 is a resin supplying device between the circuit board surface 7 and the semiconductor chip 8, keeping the chip pressed by a clamping device 9. Device 12 is a heating device for curing the resin supplied between the circuit board 7 and the semiconductor chip 8. A device (not shown) is employed at a removal stage 13 to remove the clamp. An example of the transfer device 10 is a belt conveyer which constructs a two-staged process, as shown in FIG. 3A. The first stage is to supply heat curable resin and the second stage is to harden it. An example of the device 11 for supplying a curable resin such as epoxy resin has a pressure-type nozzle and an example of heating device 12 has an electric resistance heater.

Next, the operation of a semiconductor device mounting apparatus (or a mounting operation of the mounting device) of this construction will be described.

Second Embodiment

Figure 5:
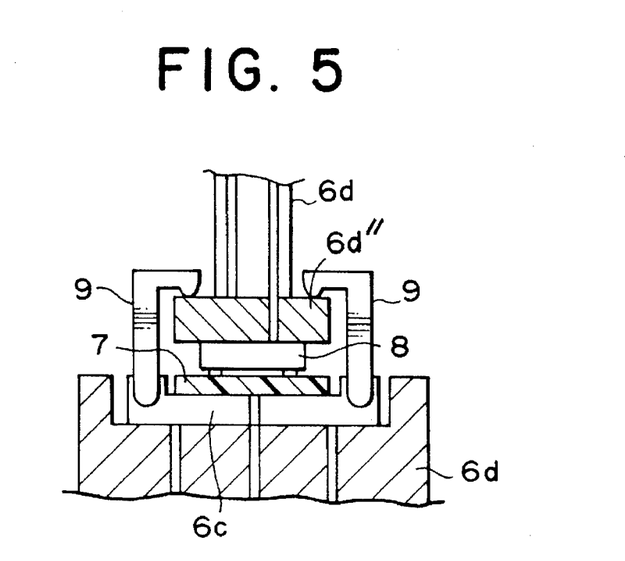
FIG. 5 shows an example of a semiconductor chip clamped onto a circuit board in accordance with the present invention.

FIGS. 4 to 8 illustrate the operation of a semiconductor device mounting apparatus. In this embodiment, the desired circuit board 7 having a circuit including connection terminals 7a is installed onto a stage accessory 6c disposed on a stage main body 6b, using a vacuum-suction method. A pick-up head accessory 6d" of a pick-up head 6d holds by suction a desired semiconductor chip 8, for example an IC bare chip or a semiconductor package similar to a bare chip, with a connection pad of the chip facing a circuit board 7. By transferring the pick-up head 6d along the X, Y, Z and rotational axes, as in FIG. 4, connecting terminals 7a of the circuit board 7 are aligned with corresponding bumps 8a of the semiconductor chip 8. Then, the semiconductor chip 8 is pressed via a pick-up head accessory 6d" of a pick-up head 6d onto the circuit board 7; in other words, the surface of connection terminals 7a of a circuit board 7 and the bumps 8a of semiconductor chip 8, which correspond to each other, are pressure-welded. After the surface of the connection terminals 7a and the bumps 8a are pressure-welded, as shown in FIG. 5, a clamp device 9 attached in a stage accessory 6c presses a semiconductor chip 8 against the surface of a circuit board 7 and thus stabilize it.

The next step is to completely stop (terminate) the operation of each vacuum-suction system such as 6a, 6a', 6d' of the installed device 6, and remove the clamped semiconductor chip 8 on the circuit board 7 from the aligning/ mounting device 6. Thus, the clamped body including the stage accessary 6c and the head accessary 6d" is transferred automatically or manually to the transfer device 10. In the transferring process operated by a transfer device 10, heat curable resin (e.g. epoxy) is supplied by the resin supplying devices 11 disposed in the transfer direction Here, heat curable resin is supplied to the peripheral area of a semiconductor chip 8 which has been aligned, mounted, pressed, and stabilized.

Figure 6:
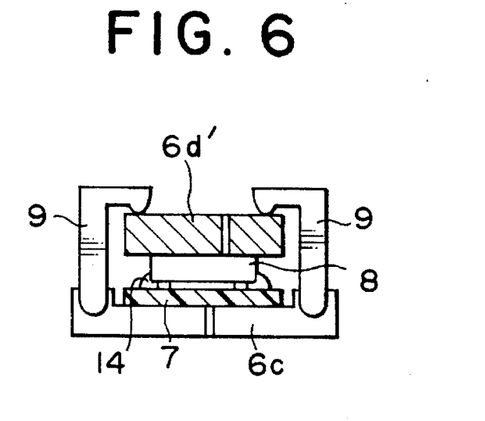
FIG. 6 shows an example of sealing resin filling in a space formed between lower surface of the semiconductor chip and an upper surface of a circuit board in accordance with the present invention.

FIG. 6 thus illustrates how the heat curable resin 14 is supplied in the peripheral area of the semiconductor chip 8. As the heat curable resin 14 has lower fluidity, it remains in the peripheral area of the semiconductor chip. Being kept in a clamped state even after the supplying of a heat curable resin 14, a semiconductor chip is transferred to the heating device 12 disposed along the transfer device 10. In this process, the fluidity of the resin is increased, so an appropriate heating temperature and transfer speed should be decided to decrease the fluidity of the resin 14 to obtain favorable fluidity for easy filling.

In the transfer process operated by the transfer devices 10, the fluidity of the heat-curable resin 14 increases, which enables (1) easy filling of the resin between the circuit board 7 and the semiconductor chip 8 with the help of capillary action, and (2) strong binding and integration of the board and the chip by heat curing. Here, the corresponding connection terminals 7a of the circuit board and the bumps 8a of the semiconductor chip 8 are pressure-welded to each other, which results in highly reliable connection without the fear that invasion of the resin may form an insulation layer.

Figure 7:
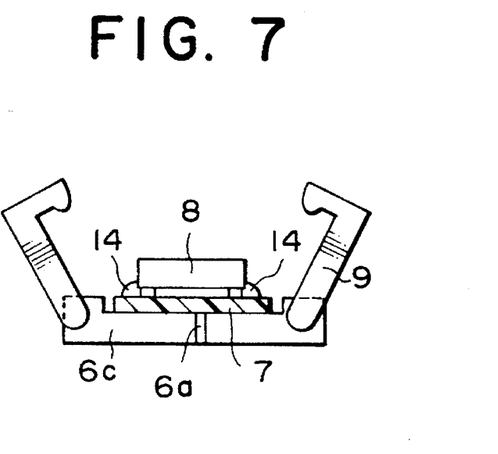
FIG. 7 is a sectional view showing an example of removing a clamp after curing of sealing resin in accordance with the present invention.
Figure 8:
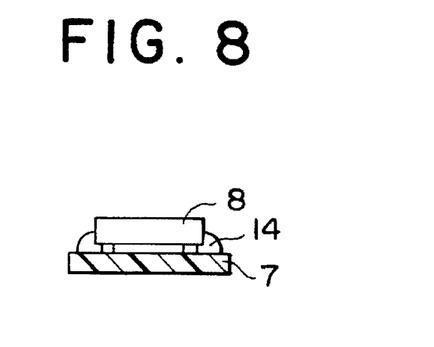
FIG. 8 is a sectional view showing an example of a construction of components of a semiconductor package in accordance with the present invention.
Figure 9:
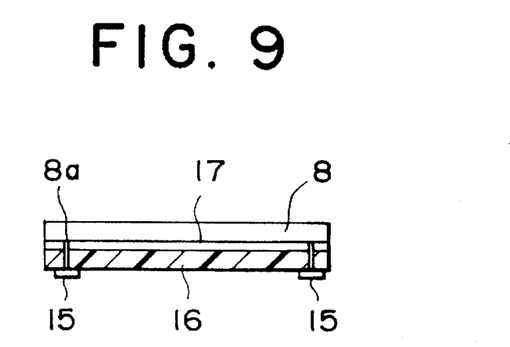
FIG. 9 is a sectional view showing an example of a construction of a semiconductor package fabricated by the method in accordance with the present invention.

In the transfer process operated by the transfer devices 10, as shown in FIG. 7, the clamp device 9 should be removed from the transfer devices 10 after heat curing of the sealing resin is completed. The pick-up head accessory 6d" and the stage accessory 6c should also be removed, so that the device mounted with the semiconductor chip, as shown in FIG. 8, can be easily constructed.

In the previous paragraphs, an example of mounting and packaging semiconductor chip 8 on the surface of the desired circuit board 7 has been described. However, it is also possible to fabricate a semiconductor package with a construction shown by the sectional view of FIG. 9. Firstly, a thin insulation board (a similar shape to the bare chip to be mounted) having a wiring circuit including connection terminals on the front side, and having electrode terminals 15 flatly exposed on the other (rear) side is prepared. Secondly, as in the process of packaging the semiconductor chip 8 on the circuit board 7, the bare chip 8 is mounted on this thin insulation board 16 to be clamped onto the insulation board 16. Thirdly, with the bare chip still clamped, a sealing resin 17 is supplied and filled in the space formed between the bare chip 8 and the insulation board 16, and then the heat curing process is applied. These processes enable fabrication, with low cost and high productivity, of a semiconductor package having electrode terminals 15 flatly exposed on their other (rear) side.

In the method of fabricating the semiconductor package and in the packaging method mentioned above, to keep the semiconductor chip 8 firmly clamped, which has been aligned and mounted on a thin insulation board 16 or on a circuit board 7, heating at a temperature of not more than 300° C. resulted in better bonding and more reliable electric connection between the connection terminals 7a and 8a.

After the clamping process, in a process for supplying a sealing resin in the space formed between the thin insulation board and the semiconductor chip or between the circuit board and the semiconductor chip, heating at not more than 300° C. also resulted in better bonding and more reliable electric connection between the connection terminals 7a and 8a.

As stated above, this semiconductor device mounting apparatus can be used for fabricating as well as for mounting semiconductor packages. In such cases, the semiconductor package mounting procedure can be divided into two separate processes operating in different areas (places). The first packaging mounting process with the second packaging mounting process, or the second packaging mounting process with the first packaging mounting process, may run in parallel, which results in many benefits in productivity and cost performance.

Figure 10A:
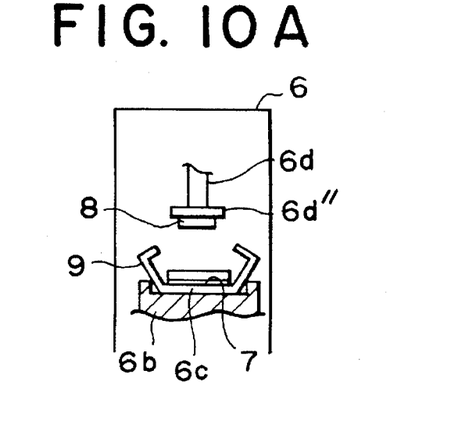
FIG. 10A, FIG. 10B and FIG. 10C are sectional views showing constructions of other principal portions of a semiconductor device mounting apparatus in accordance with the present invention.
Figure 10B:
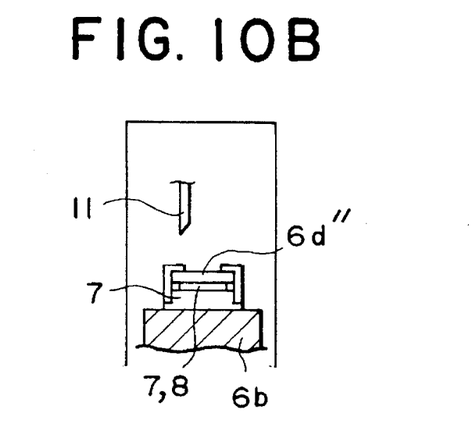
Figure 10C:
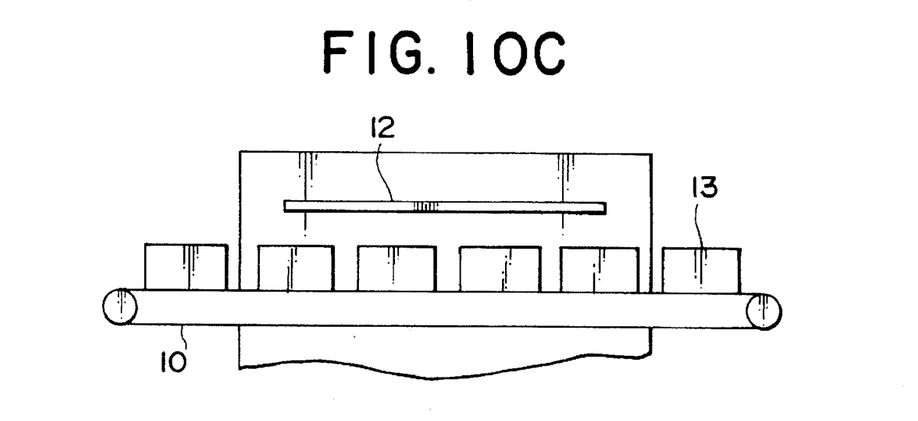

FIG. 10A, 10B and 10C are schematic views showing the other constructions of the principal portions of the semiconductor device mounting apparatus in accordance with the present invention. This is an example of a construction comprising three separate stages; namely, (1) an aligning/ mounting device 6 for aligning and mounting a semiconductor chip 8 on a predetermined surface of a circuit board 7, as shown in FIG. 10A; (2) a resin supplying device 11 for supplying resin to a clamped body comprising a clamped stage accessory 6c, the circuit board 7, the semiconductor chip 8 and a pick-up head accessory 6d", as shown in FIG. 10B; and (3) a transfer device 10 installed with a heating device 12 for hardening a heat curable resin provided by the resin supplying device 11, as shown in FIG. 10C. The operation or usage of this semiconductor device mounting apparatus divided into three parts are the same as those of the device illustrated in FIGS. 3A, 3B and 3C.

Having described a specific embodiment of the invention, it is believed obvious that modification and variation of is possible within the spirit and scope of the invention (as hereinafter claimed). For example, instead of a multi-layer resin-type circuit board, a thick-film-type circuit board can be used. To replace a bare-chip-type semiconductor, a semiconductor package (package type semiconductor) the principal portion of which is sectionally illustrated in FIG. 9 may be used.

As described above, a method of semiconductor package fabrication, a method of mounting semiconductor chips or semiconductor packages, and a semiconductor device mounting apparatus, based on a pressure-welding method in accordance with the present invention, enable packaging or mounting of semiconductor chips at high productivity and low-cost. By separating the mounting process of the semiconductor chips onto circuit boards from the pressure welding process of the mounted semiconductor device, separate proceedings of the two procedures are done without letting them interfere with each other. Even while one of the two procedures is going ahead, the other one can be forwarded in parallel. By largely cutting stroke waiting time and dispelling the problems including general waiting time, this method can bring about a substantial increase in productivity. Furthermore, in the sequence of processes mentioned above, connection terminals and bumps of a semiconductor chip are kept pressure-welded by a clamping device, which results in highly reliable electrical and mechanical connection.

What is claimed is:

1. A method of fabricating a semiconductor package comprising the steps of:

setting a semiconductor chip having a pad with protruding electrodes on an insulation board having a main surface on which a wiring circuit and connection terminals are formed and an other main surface on which flat-type external connecting terminals are formed, to align the protruding electrodes of the semiconductor chip with the connection terminals of the insulating board, wherein the insulating board is installed on a pressing stage;

pressing the semiconductor chip onto the insulation board to connect the protruding electrodes to the connection terminals;

clamping the semiconductor chip and the insulation board by clamping means to form a clamped unit which keeps the pressure on the semiconductor chip and the insulation board;

transferring the clamped unit from the pressing stage to a resin supplying stage;

supplying a sealing resin in a space formed between an upper surface of the circuit board and a lower surface of the semiconductor chip in the clamped unit;

transferring the resin supplied unit from the resin supplying stage to a resin curing stage;

curing the sealing resin filled in the space formed between the upper surface of the insulation board and the lower surface of the semiconductor chip in the clamped unit; and removing the clamping means from the clamped unit after the curing of the sealing resin is completed.

2. The method of claim 1, wherein the resin supplying stage and the resin curing stage are provided in a conveyer system.

3. The method of claim 1, wherein the clamped unit is further heat-treated at a temperature of not more than 300° C.

4. The method of claim 1, wherein the step of supplying the sealing resin comprises a heat treatment at a temperature of not more than 300° C.

5. A method of mounting a semiconductor device comprising the steps of:

setting a semiconductor chip having pads with protruding electrodes on a circuit board having a main surface on which a wiring circuit including connection terminals, to oppose the pads of the semiconductor chip to the connection terminals of the circuit board and to align the protruding electrodes with the connection terminals, wherein the circuit board is positioned on a pressing stage;

pressing the semiconductor chip onto the circuit board to connect the protruding electrodes to the connection terminals;

clamping the semiconductor chip and the circuit board by clamping means to form a clamped unit which keeps the pressure on the semiconductor chip and the circuit board;

transferring the clamped unit from the pressing stage to a resin supplying stage;

supplying a sealing resin in a space formed between an upper surface of the circuit board and a lower surface of the semiconductor chip in the clamped unit;

transferring the resin supplied unit from the resin supplying stage to a resin curing stage;

curing the sealing resin filled in the space formed between the upper surface of the circuit board and the lower surface of the semiconductor chip in the unit; and removing the clamping means from the unit after the curing of the sealing resin is completed.

6. The method of claim 5, wherein the resin supplying stage and the resin curing stage are provided in a conveyer system.

7. The method of claim 5, wherein the clamped unit is further heat-treated at a temperature of not more than 300° C.

8. The method of claim 5, wherein the step of supplying the sealing resin comprises a heat treatment at a temperature of not more than 300° C.

9. A method of mounting a semiconductor package comprising the steps of:

setting a semiconductor package having a flip chip formed and molded on a main surface of an insulation board and having flat type external connection terminals led through and exposed on another main surface of the insulation board on a circuit board having a wiring circuit including connection terminals, to align the connection terminals of the circuit board with the external connection terminals, wherein the circuit board is placed on a pressing stage;

pressing the semiconductor package onto the circuit board to connect the external connection terminals to the connection terminals;

clamping the semiconductor package and the circuit board by clamping means to form a clamped unit which keeps the pressure on the semiconductor package and the circuit board;

transferring the clamped unit from the pressing stage to a resin supplying stage;

supplying a sealing resin in a space formed between an upper surface of the circuit board and a lower surface of the semiconductor package in the clamped unit to fill the space;

transferring the resin supplied unit from the resin supplying stage to a resin curing stage;

curing the sealing resin filled in the space formed between the upper surface of the circuit board and the lower surface of the semiconductor package in the unit; and removing the clamping means from the unit after the curing of the sealing resin is completed.

10. The method of claim 9, wherein the resin supplying stage and the resin curing stage are provided in a conveyer system.

11. The method of claim 9, wherein the clamped unit is further heat-treated at a temperature of not more than 300° C.

12. The method of claim 9, wherein the step of supplying the sealing resin comprises a heat treatment at a temperature of not more than 300° C.

* * * * *